US012628361B2

(12) United States Patent
Kim et al.

(10) Patent No.: US 12,628,361 B2
(45) Date of Patent: May 12, 2026

(54) DIELECTRIC HAVING HIGH-DIELECTRIC CONSTANT, METHOD OF MANUFACTURING THE SAME, TARGET MATERIAL FOR MANUFACTURING THE DIELECTRIC, ELECTRONIC DEVICE INCLUDING THE DIELECTRIC, AND ELECTRONIC APPARATUS INCLUDING THE ELECTRONIC DEVICE

(71) Applicant: Samsung Electronics Co., Ltd., Suwon-si (KR)

(72) Inventors: Hyungjun Kim, Suwon-si (KR); Yong-Hee Cho, Suwon-si (KR); Yongsung Kim, Suwon-si (KR); Boeun Park, Hwaseong-si (KR); Jeongil Bang, Suwon-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 900 days.

(21) Appl. No.: 17/841,035

(22) Filed: Jun. 15, 2022

(65) Prior Publication Data

US 2023/0178584 A1 Jun. 8, 2023

(30) Foreign Application Priority Data

Dec. 8, 2021 (KR) ........................ 10-2021-0175201

(51) Int. Cl.
*H10D 1/68* (2025.01)
*C23C 14/08* (2006.01)
(Continued)

(52) U.S. Cl.
CPC ........... *H10D 1/684* (2025.01); *C23C 14/088* (2013.01); *C23C 14/3414* (2013.01);
(Continued)

(58) Field of Classification Search
CPC .......... H10D 1/684; H10D 1/68; H10D 1/682; C23C 14/088; C23C 14/3414;
(Continued)

(56) References Cited

U.S. PATENT DOCUMENTS 5,721,043 A 2/1998 Summerfelt et al.
7,838,133 B2 * 11/2010 Zhang ................. H01G 4/1227
204/192.15

(Continued)

FOREIGN PATENT DOCUMENTS

CN 1303959 A 7/2001
JP H06-112432 A 4/1994
(Continued)

OTHER PUBLICATIONS

J. H. Shim et al, "Process. property relationship in high-k ALD SrTiO3 and BaTiO3:a review" Journal of Materials Chemistry C, 5, 8000-8013, Jun. 8, 2017.
(Continued)

*Primary Examiner* — Shahed Ahmed
*Assistant Examiner* — Khatib A Rahman
(74) *Attorney, Agent, or Firm* — Harness, Dickey & Pierce, P.L.C.

(57) ABSTRACT

Disclosed are a high-dielectric and method of manufacturing the same, a target material used for manufacturing the high-dielectric, an electronic device including the high-dielectric, and an electronic apparatus including the electronic device. The high-dielectric includes a first material including oxygen and at least two components, and a second material different from the first materials. The first material is a dielectric having a dielectric constant greater than a dielectric constant of silicon oxide, and the second material is an element for reducing a crystallization temperature of the first material. The content of the second material with
(Continued)

respect to the first material may be within a range that does not deteriorate leakage current characteristics of the first material. The content of the second material may be in a range of about 0.1 atomic % to about 10 atomic %, about 0.1 atomic % to about 8.5 atomic %, or about 0.1 atomic % to about 2 atomic %.

20 Claims, 10 Drawing Sheets

(51) Int. Cl.

| | |
|---|---|
| *C23C 14/34* | (2006.01) |
| *C23C 16/06* | (2006.01) |
| *C23C 16/455* | (2006.01) |
| *C23C 28/00* | (2006.01) |
| *H10B 12/00* | (2023.01) |
| *H10F 77/30* | (2025.01) |

(52) U.S. Cl.

CPC ........ *C23C 16/06* (2013.01); *C23C 16/45527* (2013.01); *C23C 28/32* (2013.01); *C23C 28/3455* (2013.01); *H10B 12/31* (2023.02); *H10F 77/311* (2025.01)

(58) Field of Classification Search

CPC ... C23C 16/06; C23C 16/45527; C23C 28/32; C23C 28/3455; C23C 14/18; C23C 16/409; C23C 16/45525; C23C 28/34; C23C 28/36; C23C 14/08; C23C 14/3407; H10B 12/31; H10B 12/30; H10F 77/311; H10F 77/169

See application file for complete search history.

(56) References Cited

U.S. PATENT DOCUMENTS

| | | | |
|---|---|---|---|
| 10,043,655 B2 | 8/2018 | Swaminathan et al. | |
| 10,186,570 B2 | 1/2019 | Hendrix et al. | |
| 10,741,678 B2 * | 8/2020 | Lu | H10D 64/033 |
| 2005/0142715 A1 * | 6/2005 | Sakoda | H01L 21/022 |
| | | | 257/E21.267 |
| 2007/0053139 A1 | 3/2007 | Zhang et al. | |
| 2010/0176431 A1 | 7/2010 | Tanioku | |
| 2014/0134823 A1 * | 5/2014 | Hendrix | C23C 16/45531 |
| | | | 438/785 |
| 2019/0148067 A1 | 5/2019 | Hirata | |
| 2019/0148390 A1 * | 5/2019 | Frank | H01L 21/0228 |
| | | | 257/295 |
| 2019/0165088 A1 | 5/2019 | Cho et al. | |
| 2019/0267383 A1 | 8/2019 | Rocklein et al. | |
| 2019/0355806 A1 | 11/2019 | Kang et al. | |
| 2020/0020780 A1 | 1/2020 | Kim | |
| 2020/0312952 A1 | 10/2020 | Cho et al. | |
| 2020/0321472 A1 | 10/2020 | Ramamoorthy et al. | |
| 2021/0202508 A1 * | 7/2021 | Jeon | H10D 1/68 |

FOREIGN PATENT DOCUMENTS

| | | |
|---|---|---|
| JP | 10-079470 | 3/1998 |
| JP | 2010-165722 A | 7/2010 |
| JP | 2014-520404 A | 8/2014 |
| JP | 2016-032015 A | 3/2016 |
| KR | 10-2000-0074727 A | 12/2000 |
| KR | 10-2002-0079045 A | 10/2002 |
| KR | 10-0364793 B1 | 12/2002 |

OTHER PUBLICATIONS

Sang Woon Lee et al, "Atomic Layer Deposition of SrTiO3 Thin Films with Highly Enhanced Growth Rate for Ultrahigh Density Capacitors" Chem. Mater., 23, 2227-2236, Mar. 30, 2011.

W.J.Kim et al, "Structural and microwave properties of (Ba, Sr) TiO3 films grown by pulsed laser deposition," Appl. Phys. A 70, 313-316, Mar. 2000.

Notice of Non-Final Rejection issued Apr. 15, 2024 in Korean Application No. 10-2021-0175201.

* cited by examiner

</div>

<DTD1>

(100)  (110)  (111)  (200)  (211)

P21

TEMPERATURE (℃)

2θ Cu-Kα (degrees)

<1.5% In-DTD1>

P22

TEMPERATURE (℃)

2θ Cu-Kα (degrees)

1

DIELECTRIC HAVING HIGH-DIELECTRIC CONSTANT, METHOD OF MANUFACTURING THE SAME, TARGET MATERIAL FOR MANUFACTURING THE DIELECTRIC, ELECTRONIC DEVICE INCLUDING THE DIELECTRIC, AND ELECTRONIC APPARATUS INCLUDING THE ELECTRONIC DEVICE

CROSS-REFERENCE TO RELATED APPLICATION

This application is based on and claims priority under 35 U.S.C. § 119 to Korean Patent Application No. 10-2021-0175201, filed on Dec. 8, 2021, in the Korean Intellectual Property Office, the disclosure of which is incorporated by reference herein in its entirety.

BACKGROUND

1. Field

The disclosure relates to high-dielectrics and applications thereof, and more particularly, to high-dielectrics and methods of manufacturing the same, target materials for manufacturing the high-dielectrics, electronic devices including the high-dielectrics, and electronic apparatuses including the electronic devices.

2. Description of Related Art

As the degree of integration of semiconductor devices increases, the demand for dielectric materials capable of increasing capacitance in the same and/or smaller areas has also increased.

As a dielectric, $SiO_2$ having a dielectric constant of 3.9 was initially used, and afterwards, $Al_2O_3$ or $ZrO_2$, etc., have been used as high-dielectric constant materials having a higher dielectric constant.

However, as the degree of integration of semiconductor devices has further continuously increased, a dielectric having a higher permittivity than that of a conventional binary oxide-based dielectric is required. Perovskite type materials have been considered as dielectric materials that may meet these requirements, but there are limitations in the manufacturing process thereof. In addition, it has been reported that the dielectric properties of perovskite dielectrics vary greatly depending on crystallinity.

SUMMARY

Provided are high-dielectrics with reduced crystallization temperatures and/or crystallization initiation temperatures.

Provided are sputtering targets for manufacturing the high-dielectrics.

Provided are methods of manufacturing the high-dielectrics.

Provided are electronic devices including the high-dielectrics.

Provided are electronic apparatuses including the electronic devices.

Additional aspects will be set forth in part in the description which follows and, in part, will be apparent from the description, or may be learned by practice of the presented embodiments of the disclosure.

According to some example embodiments, a high-dielectric includes a first material having a dielectric constant greater than a dielectric constant of silicon oxide and including oxygen and at least two components; and a second material different from the first material, wherein the second material reduces a crystallization temperature of the first material.

In some examples, a content of the second material with respect to the first material may be within a range that does not deteriorate a leakage current characteristic of the first material. In some examples, the content of the second material may be in a range of about 0.1 atomic % to about 10 atomic %, about 0.1 atomic % to about 8.5 atomic %, or about 0.1 atomic % to about 2 atomic %. In some examples, the first material may include at least one of a ternary or quaternary perovskite material.

In some examples, the second material may include indium (In).

In some examples, the second material may be uniformly distributed in the first material.

In some examples, the first material may include a plurality of sequentially stacked layers, and the second material may be included in a second material layer between at least two of the plurality of the sequentially stacked layers. The second material layer may be completely embedded in the first material.

In some examples, the first material may include at least a first and a second region, and the second material may be included in only the first region of the first material.

In some examples, the second material layer may form a plurality of layers separated from each other in the first material.

According to some example embodiments, a sputtering target for forming a high-dielectric layer, includes a first source material including at least two different components other than oxygen such that a first material including an oxide of the at least two different components has, and a second source material coupled to the first material. The second source material may include a component that reduces a crystallization temperature of the first material.

In some examples, the first material may include a perovskite-based dielectric component. The first material may include a first to third components different from each other.

In some examples, the second source material may include indium (In).

In some examples, the second source material of the target may have a content so that a content of a second material of a high-dielectric layer formed of the first and second materials which is formed by sputtering the target is within a range that does not deteriorate a leakage current characteristic of the first material. The range may be about 0.1 atomic % to about 10 atomic %, about 0.1 atomic % to about 8.5 atomic %, or about 0.1 atomic % to about 2 atomic %.

According to some example embodiments, a method of manufacturing a high-dielectric, the method includes supplying a source material such that a perovskite dielectric having a dielectric constant greater than that of silicon oxide is formed, and supplying a material for reducing a crystallization temperature of the perovskite dielectric while maintaining dielectric properties of the perovskite dielectric.

In some examples, at least one of the source material or the material for reducing the crystallization temperature may be supplied using atomic layer deposition (ALD).

In some examples, at least one of the source material or the material for reducing the crystallization temperature may be supplied using a target material in physical vapor deposition (PVD).

In some examples, the source material and the material for reducing the crystallization temperature may be simultaneously supplied.

In some examples, the source material may include precursors including components of the perovskite dielectric, and the material for reducing the crystallization temperature may be included in the precursors.

In some examples, the source material and the material for reducing the crystallization temperature may be included in the same target material.

In some examples, the material for reducing the crystallization temperature may be supplied such that a content of the material for reducing the crystallization temperature is within a range that does not deteriorate a leakage current characteristic of the perovskite dielectric.

In some examples, the material for reducing the crystallization temperature may be supplied such that the material for reducing the crystallization temperature is evenly distributed in the finally formed high-dielectric.

In some examples, the source material may be supplied to form a plurality of layers, and the material for reducing the crystallization temperature may be supplied to form a layer between the plurality of layers. The layer formed between the plurality of layers of the material for reducing the crystallization temperature may be completely embedded in the plurality of layers.

In some examples, the material for reducing the crystallization temperature may be supplied so as to be distributed only in a partial region of the finally formed high-dielectric.

In some examples, the source material may include first to third components different from oxygen and different from each other.

In some examples, the material for reducing the crystallization temperature may include indium (In). The indium (In) may be supplied so that the content of indium (In) in the final high-dielectric material is in a range of about 0.1 atomic % to about 10 atomic %, about 0.1 atomic % to about 8.5 atomic %, or about 0.1 atomic % to about 2 atomic %.

According to some example embodiments, an electronic device includes a first stack, a second stack, and a high-dielectric layer between the first and second stacks. The high-dielectric layer may include the high-dielectric according to an embodiment described above.

In some examples, the first stack may include a first portion of a configuration constituting a solar cell including the high-dielectric layer, and the second stack may include a second portion constituting the solar cell.

In some examples, the first stack may include a first electrode layer, the second stack may include a second electrode layer, and the first and second electrode layers and the high-dielectric layer may constitute a capacitor.

According to some example embodiments, a memory device includes a transistor and a data storage element coupled to the transistor, wherein the data storage element includes the electronic device according to an embodiment described above.

According to some example embodiment, an electronic apparatus including a memory device, includes the memory device includes the memory device according to an embodiment described above.

BRIEF DESCRIPTION OF THE DRAWINGS

The above and other aspects, features, and advantages of certain example embodiments of the disclosure will be more apparent from the following description taken in conjunction with the accompanying drawings, in which.

DETAILED DESCRIPTION

Figure 1:
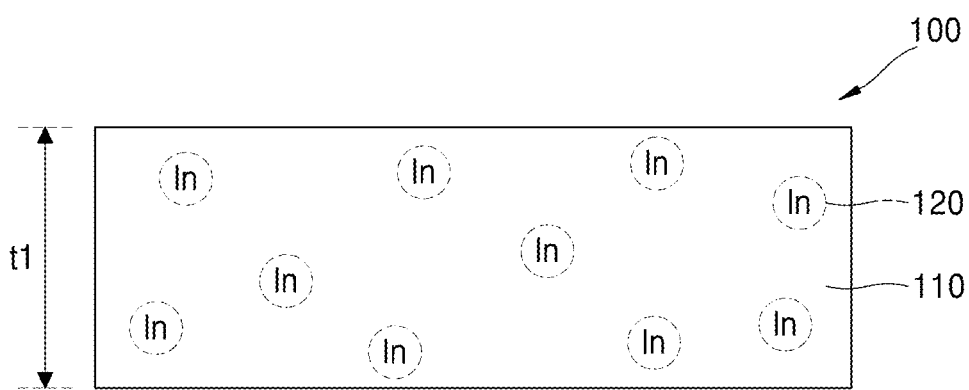
FIG. 1 is a cross-sectional view illustrating a first high-dielectric capable of reducing a crystallization temperature, according to some example embodiments.

Reference will now be made in detail to certain example embodiments, examples of which are illustrated in the accompanying drawings, wherein like reference numerals refer to like elements throughout. In this regard, the example embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Although numerical terms such as "first," "second," "third," etc., may be used herein to describe various elements, components, regions, layers, and/or sections, these numerical terms are only used to distinguish one element, component, region, layer, or section, from another region, layer, or section; and the elements, components, regions, layers, and/or sections, and should not be otherwise limited by these numerical terms. Thus, a first element, component, region, layer, or section, discussed below may be termed a second element, component, region, layer, or section, without departing from the scope of this disclosure.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around stated numerical values or shapes.

Hereinafter, a high-dielectric and a method of manufacturing the same, a target material used for manufacturing the high-dielectric, an electronic device including the high-dielectric, and an electronic apparatus including the high-dielectric according to an embodiment will be described in detail with reference to the accompanying drawings. In the drawings, thicknesses of layers and regions may be exaggerated for clarification of the specification. The embodiments may be variously modified and may be embodied in many different forms. Additionally, when an element or layer is referred to as being "on" or "above" another element or layer, the element or layer may be directly on another element or layer or intervening elements or layers.

Herein, a high-dielectric has a dielectric constant greater than that of silicon oxide (e.g., $SiO_2$). In some examples, the high-dielectric includes a first material having a high-dielectric constant and a second material included in the first material in a given ratio. Depending on the content of the second material, the second material may negatively affect the dielectric properties of the first material. For example, the second material may negatively affect leakage current characteristics of the first material according to the content of the second material. Accordingly, the content of the second material, with respect to the first material, may be limited to some extent that does not negatively affect the dielectric properties of the first material. For example, the content of the second material included in the first material may be at least one of 10 atomic % or less, 9 atomic % or less, 8.5 atomic % or less, 5 atomic % or less, and/or 3 atomic % or less. In some example embodiments, the content of the second material may be, e.g., in a range of about 0.1 atomic % to about 8.5 atomic %, in a range of about 0.1 atomic % to about 5 atomic %, in a range of about 0.1 atomic % to about 3 atomic %, in a range of about 0.1 atomic % to about 2 atomic %, 1.5 atomic %, and/or 1.5 atomic % or less. In some examples, the first material may include a ternary and/or quaternary perovskite material. For example, the ternary material may include $SrTiO_3$ (STO), and the quaternary material may include $BaSrTiO_3$ (BST), but the example embodiments are not limited thereto. In some examples, the first material may be $Ba_xSr_{1-x}TiO_3$ (0<x<1). As described in greater detail below, the first material may have a form of a material layer. In some examples, a thickness of the material layer may be in a range of about 0.1 nm to about 1,000 nm, but the example embodiments not limited thereto. In some examples, the second material may be (and/or include) indium (In), but the example embodiments are be limited thereto. The second material may be uniformly or non-uniformly distributed in the first material within the content described above, or may be provided in the form of a material layer (e.g., in the material layer of the first material).

In some examples, the high-dielectric may be a single crystal and/or polycrystalline, and may include some amorphous material together with the polycrystalline structure and/or structures.

Such a high-dielectric material may be manufactured or formed by various methods, such as a deposition method based on a chemical vapor deposition (CVD) including ALD, a PVD-based sputtering, a pulsed laser deposition (PLD), and/or the like.

When the method of forming the high-dielectric is a CVD method including atomic layer deposition (ALD), the number of ALD cycles for depositing the first material and the number of ALD cycles for depositing the second material may be determined in consideration of the content of the second material. For example, if the content of the second material is satisfied when the first material is formed by stacking nine atomic layers and the second material is formed by stacking one atomic layer, the number of ALD cycles for depositing the first material may be nine, and the number of ALD cycles for depositing the second material may be one.

Also, the method of forming a high-dielectric may include a method of supplying the second material to the first material. For example, a method of doping the second material into the first material may vary the supply of the second material. For example, when the high-dielectric is formed by using an ALD method, and the perovskite dielectric having an $ABO_3$ structure is BSTO, the second material may be supplied, within the content described above, to an ALD chamber in a state of being included in a precursor of a first component (e.g., Ba) of the first material, a precursor of a second component (e.g., Sr) of the first material, and a precursor of a third component (e.g., Ti) of the first material which are source materials. The precursors of the first to third components that are the source materials and the second material may be simultaneously supplied to the ALD chamber.

When the high-dielectric is formed by using a vacuum deposition method, such as sputtering, as will be described later, the second material may be included in the target material. In these cases, the content of the second material included in the target material may be within the range of the content described above. In some examples, when the content of the second material included in the target material is different from the range of the content described above (for example, when the content of the second material included in the target material is greater than the range of the content described above) the content of the second material included in the high-dielectric finally formed may be adjusted to satisfy the content range described above by controlling a sputtering operation and/or operating conditions.

Because the target material includes a source material (a first material) and a material for reducing a crystallization temperature, in a deposition process, the source material and the material for reducing the crystallization temperature may be simultaneously supplied on the substrate.

Hereinafter, the disclosed high-dielectric and a method of manufacturing the high-dielectric will be described through some example embodiments.

FIG. 1 shows a first high-dielectric 100 capable of reducing a crystallization temperature according to some example embodiments.

Referring to FIG. 1, the first high-dielectric 100 includes a material layer 110 having a high-dielectric constant and a material element 120 included in the material layer 110. The material elements 120 may be evenly distributed over the entire material layer 110, but may also be unevenly distributed. The material layer 110 may be a layer including the first material. The material element 120 may be the second material. In some example embodiments, the material element 120 may be implanted into the material layer 110 using a doping method using a dopant including indium, and after implantation, a heat treatment operation may be performed so that the material element 120 is evenly distributed in the material layer 110. The heat treatment operation may be performed at a temperature less than a crystallization temperature. After the heat treatment operation, the first high-dielectric 100 may undergo a process of heat treatment or annealing for crystallization. In some examples, after the material layer 110 is doped with the material element 120, a process of heat treatment or annealing for crystallization may be performed without the heat treatment operation. In other words, the crystallization process may be performed in a state that the material element 120 is non-uniformly distributed.

Figure 2:
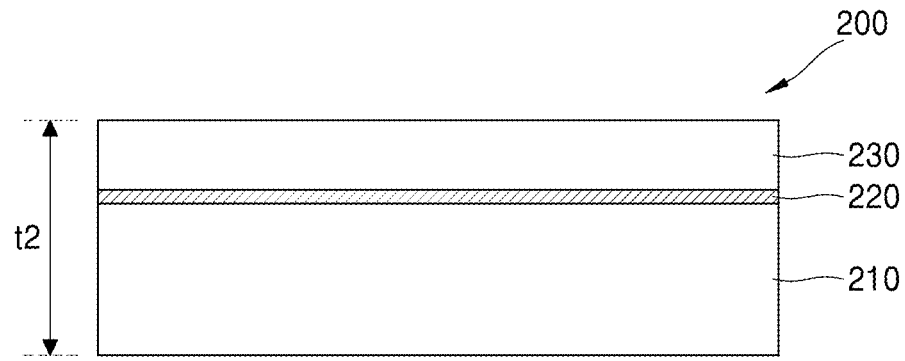
FIG. 2 is a cross-sectional view illustrating a second high-dielectric according to some example embodiments.

FIG. 2 shows a second high-dielectric 200 according to some example embodiments.

Referring to FIG. 2, the second high-dielectric 200 may include a first layer 210, a second layer 220, and a third layer 230, which are sequentially stacked. The first layer 210 and the third layer 230 may be layers including the first material. The second layer 220 may be a layer including the second material. In some examples, the first to third layers 210, 220, and 230 may be formed by using an ALD method. In some examples, the second layer 220 may be formed under the first layer 210 instead of being formed between the first and third layers 210 and 230. For example, the second layer 220 may be first formed before the first and third layers 210 and 230. In some example embodiments, the second layer 220 may be formed on the third layer 230. For example, the second layer 220 may be formed last among the first to third layers 210, 220, and 230. In either case, a thickness of the second layer 220 may be less than a thickness of at least one of the first and third layers 210 and 230. In some example embodiments, the boundary between the second layer 220 and at least one of the first and/or third layers 210 and 230 may be indistinct. For example, in some embodiments, the second material may diffuse into the first material. The thickness t2 of the second high-dielectric 200 may be the same as or different from the thickness t1 of the first high-dielectric 100 of FIG. 1.

Figure 3:
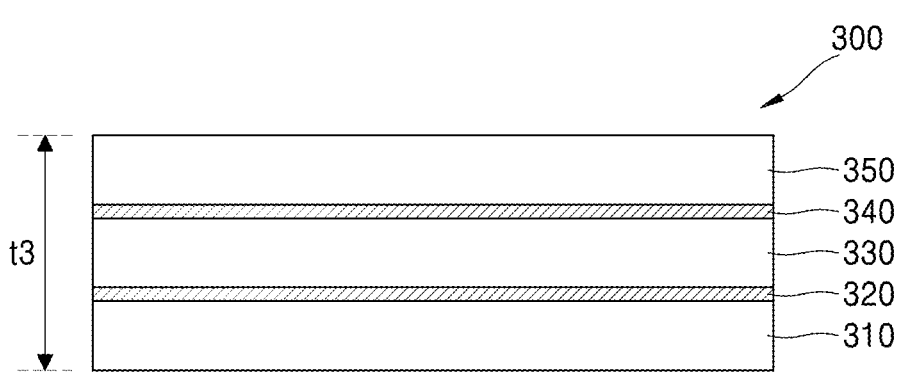
FIG. 3 is a cross-sectional view illustrating a third high-dielectric according to some example embodiments.

FIG. 3 shows a third high-dielectric 300 according to an embodiment.

Referring to FIG. 3, the third high-dielectric 300 may include sequentially stacked a first layer 310, a second layer 320, a third layer 330, a fourth layer 340, and a fifth layer 350. The first, third, and fifth layers 310, 330, and 350 may be layers including the first material. The second and fourth layers 320 and 340 may be layers including the second material. The descriptions of the formation of the first and third layers 210 and 230 of FIG. 2 may also be applied to the formation of the first, third, and fifth layers 310, 330, and 350. In some examples, thicknesses of the first, third, and fifth layers 310, 330, and 350 may be the same as or different from each other. The description of the formation of the second layer 220 of FIG. 2 may also be applied to the formation of the second and fourth layers 320 and 340. For example, one of the second and fourth layers 320 and 340 may be formed first or last. A thickness t3 of the third high-dielectric 300 may be the same as or different from the thickness t2 of the second high-dielectric 200 of FIG. 2.

Figure 4:
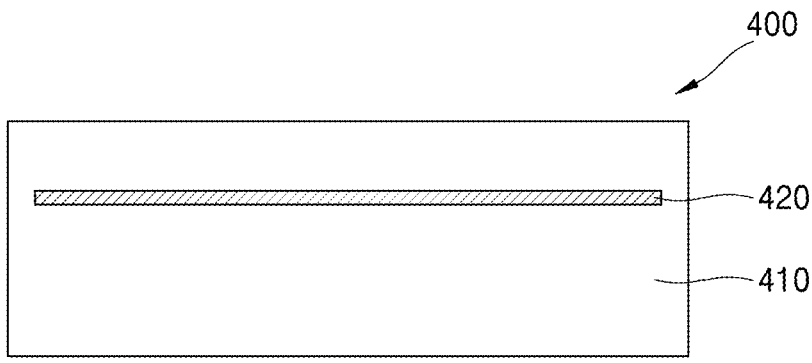
FIG. 4 is a cross-sectional view illustrating a fourth high-dielectric according to some example embodiments.

FIG. 4 shows a fourth high-dielectric 400 according to some example embodiments.

Referring to FIG. 4, the fourth high-dielectric 400 includes a first material layer 410 and a second material layer 420 buried in the first material layer 410. The first material layer 410 may be a layer including the first material. The second material layer 420 may be a layer including the second material. The description of the formation of the first and third layers 210 and 230 of FIG. 2 may also be applied to the formation of portions formed below and above the second material layer 420 of the first material layer 410. The description of the formation of the second layer 220 of FIG. 2 may also be applied to the formation of the second material layer 420.

The second material layer 420 may be formed to be embedded in the first material layer 410. In some examples, the second material layer 420 may be completely buried in the first material layer 410. Both ends of the second material layer 420 are separated from both sides of the first material layer 410.

After first forming a portion of the first material layer 410 under the second material layer 420 and covering a part of the previously formed portion (where the second material layer 420 does not exist) with a mask (after masking), the second material layer 420 may be formed on the remaining portion of the previously formed portion of the first material layer 410. After the second material layer 420 is formed, after the mask is removed, a portion of the first material layer 410 on the second material layer 420 may be formed.

Figure 5:
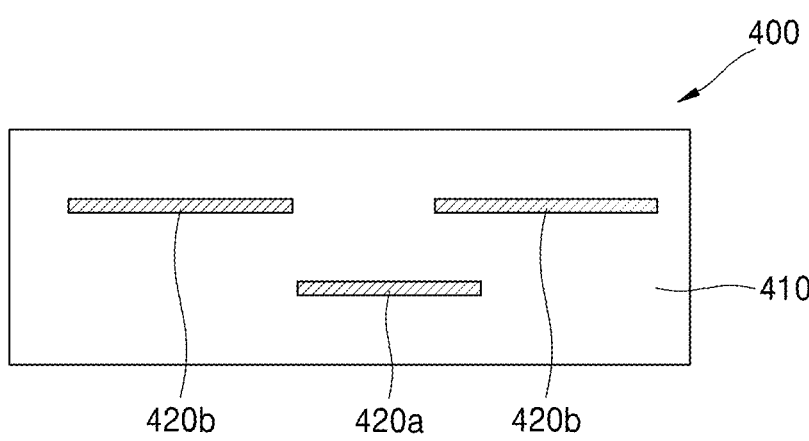
FIG. 5 is a cross-sectional view illustrating a second material layer of FIG. 4 divided into a plurality of layers.

In some examples, as shown in FIG. 5, the second material layer 420 may be divided and distributed into a plurality of layers 420a, 420b, and 420c. Though illustrated as being divided into three layers, the second material layer 420 is not limited thereto, and may be divided into three or less or three or more.

Figure 6:
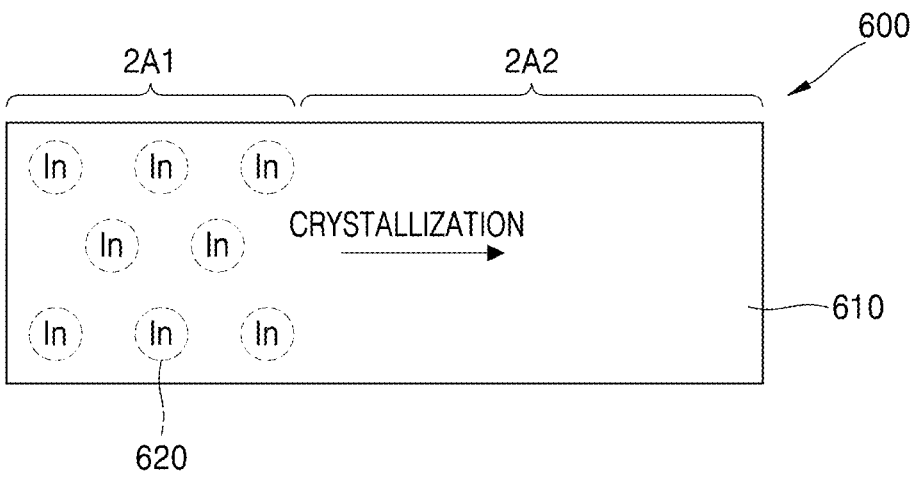
FIG. 6 is a cross-sectional view illustrating a fifth high-dielectric according to some example embodiments.

FIG. 6 shows a fifth high-dielectric 600 according to some example embodiments.

Referring to FIG. 6, the fifth high-dielectric 600 includes a material layer 610 and a material element 620 embedded in the material layer 610. The material layer 610 may be a layer including the first material. The material element 620 may be the second material. In some examples, the material element 620 may be implanted into the material layer 610 in the same manner as that of the material element 120 of FIG. 1, but is not limited thereto. The material element 620 may be present in a first region 2A1 of the material layer 610 and does not present in a second region 2A2. Sizes of the first region 2A1 and the second region 2A2 may be the same as or different from each other. For example, in some examples, the first region 2A1 may be less than the second region 2A2, or vice versa. Crystallization of the fifth high-dielectric 600 may first start in the first region 2A1, and then, proceed to the second region 2A2. The concentration of the material element 620 may be substantially constant in the first region 2A1 and/or decrease with proximity to the second region 2A2.

Figure 7:
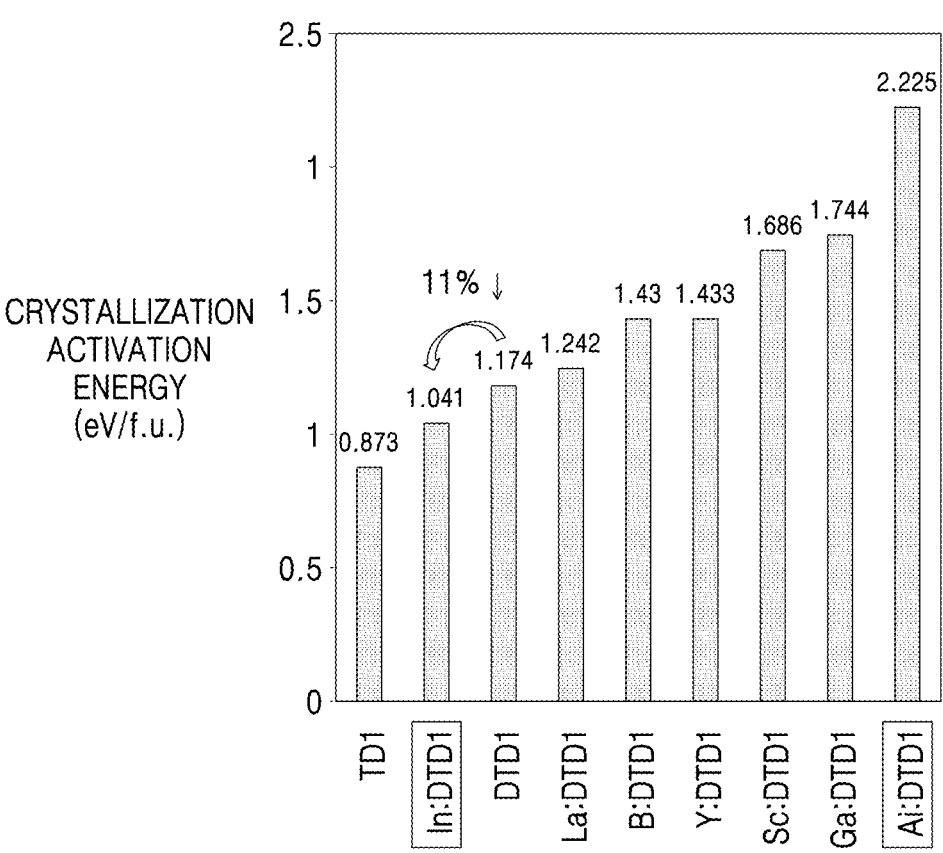
FIG. 7 is a bar graph showing simulation results for crystallization activation energy of a high-dielectric.

FIG. 7 shows simulation results for crystallization activation energy of the high-dielectric. The crystallization activation energy may be viewed as crystallization initiation energy. The horizontal axis indicates a target for measuring crystallization activation energy, and the vertical axis indicates crystallization activation energy. On the horizontal axis, DTD1 represents BSTO, and TD1 represents STO. In addition, In:DTD1 denotes In-doped DTD1, La:DTD1 denotes La-doped DTD1, B:DTD1 denotes B-doped DTD1, Y:DTD1 denotes Y-doped DTD1, Sc:DTD1 denotes Sc-doped DTD1, Ga:DTD1 denotes Ga-doped DTD1, and Al:DTD1 denotes Al-doped DTD1, respectively. In the above simulation, in the case of In:DTD1, the doping amount (content) of In as a dopant was set to in a range of about 1.5 atomic % to about 8.5 atomic %. A dopant doping amount of other measurement objects was also set in the same range.

Referring to FIG. 7, the crystallization activation energy of In:DTD1 is lowered by about 11% compared to that of DTD1. On the other hand, the crystallization activation energy of DTD1 doped with other dopants (La, B, Y, Sc, Ga, or Al) other than In is greater than that of DTD1.

The result of FIG. 7 suggests that when indium is doped into DTD1 to have a predetermined (and/or otherwise determined) content, the crystallization activation energy of DTD1 (and thereby the crystallization temperature) is reduced.

Figure 8A:
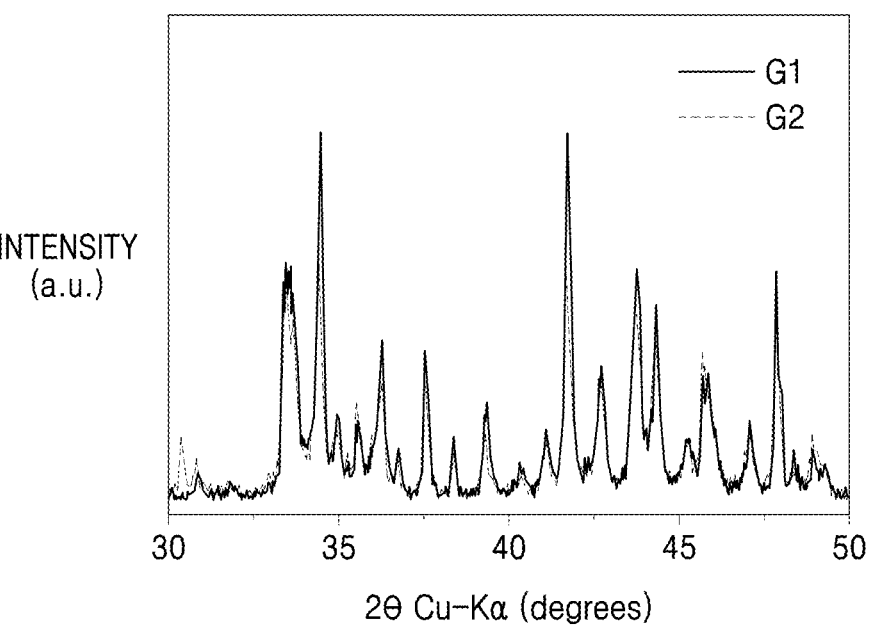
FIGS. 8A and 8B are a graph showing results of X-ray diffraction analysis for BSTO undoped with a dopant (hereinafter, first BSTO) and BSTO doped with In as a dopant to a predetermined content (hereinafter, second BSTO)
Figure 8B:
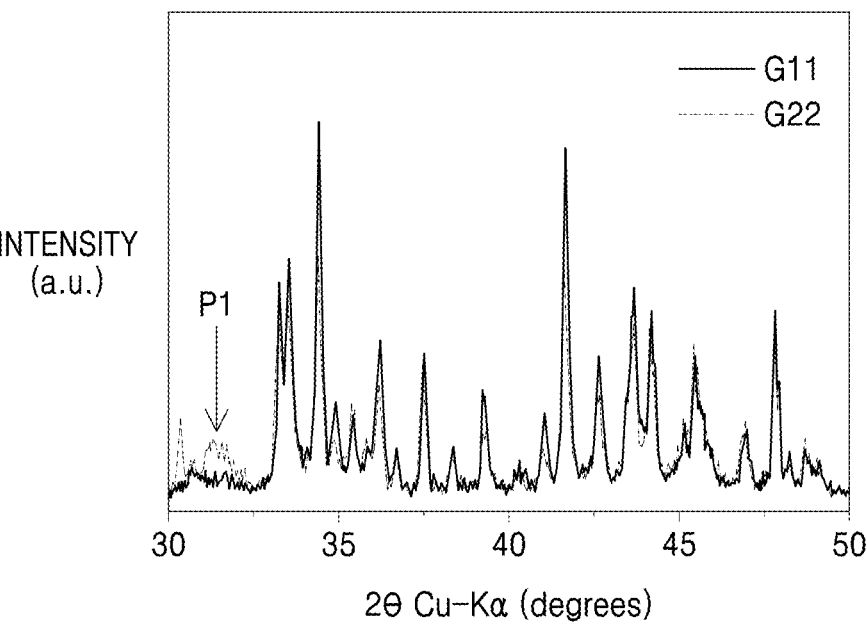

FIGS. 8A and 8B show results of X-ray diffraction (XRD) analysis for BSTO undoped with a dopant (hereinafter, first BSTO) and BSTO doped with indium (In) as a dopant (hereinafter, second BSTO). The second BSTO may be a BSTO precursor mixture including about 1.5 atomic % of In. The X-ray diffraction analysis was performed at 400° C. and 500° C.

FIG. 8A shows the results measured at 400° C., and FIG. 8B shows the results measured at 500° C. In FIGS. 8A and 8B, first graphs G1 and G11 are for the first BSTO (DTD1), and second graphs G2 and G22 are for the second BSTO (In:DTD1).

Comparing the second graphs G2 and G22 of FIGS. 8A and 8B with each other, the second graph G22 of FIG. 8B shows a peak P1 that is not present in the second graph G2 of FIG. 8A at the same diffraction angle. The peak P1 appearing in the second graph G22 of FIG. 8B indicates the start of crystallization of the second BSTO (In:DTD1).

The results of FIGS. 8A and 8B show that the BSTO (In:DTD1) doped with indium does not crystallize at 400° C., but starts to crystal at 500° C., while BSTO that is not doped with a dopant does not start crystallization at 400° C. as well as at 500° C. In other words, the results of FIGS. 8A and 8B suggest that the crystallization temperature of BSTO is reduced when In is doped into BSTO.

FIG. 9 shows results of X-ray diffraction analysis measured in-situ while raising the temperature of the first BSTO and the second BSTO to 400° C. to 1000° C.

Figures 9A, 9B:
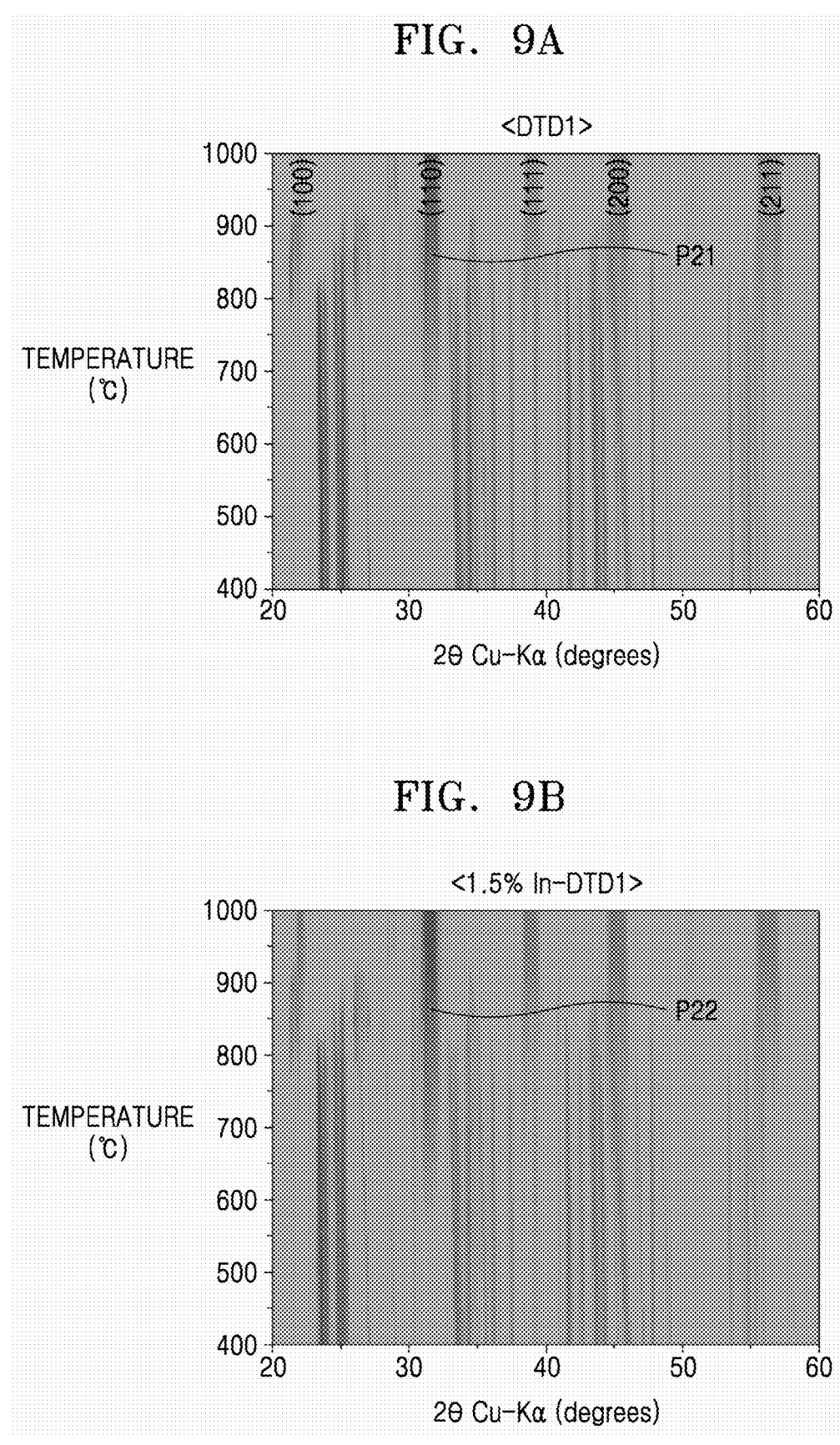
FIGS. 9A and 9B are a graph showing results of X-ray diffraction analysis measured in-situ while raising the temperature of the first BSTO and the second BSTO of FIG. 8 to 400° C. to 1,000° C.

FIG. 9A is for the first BSTO, FIG. 9B is for the second BSTO. (110) peaks P21 and P22 in FIGS. 9A and 9B are peaks indicating the start of crystallization.

Comparing FIG. 9A and FIG. 9B with each other, the temperature at which the (110) peak P21 appears in FIG. 9A is about 650° C., but the temperature at which the (110) peak P22 appears in FIG. 9B is about 550° C., which is about 100° C. lower than that of in FIG. 9A.

The results of FIGS. 9A and 9B also suggest that the crystallization temperature of the BSTO doped with a predetermined amount of In is less than the crystallization temperature of the BSTO that is not doped with a dopant.

Figure 10:
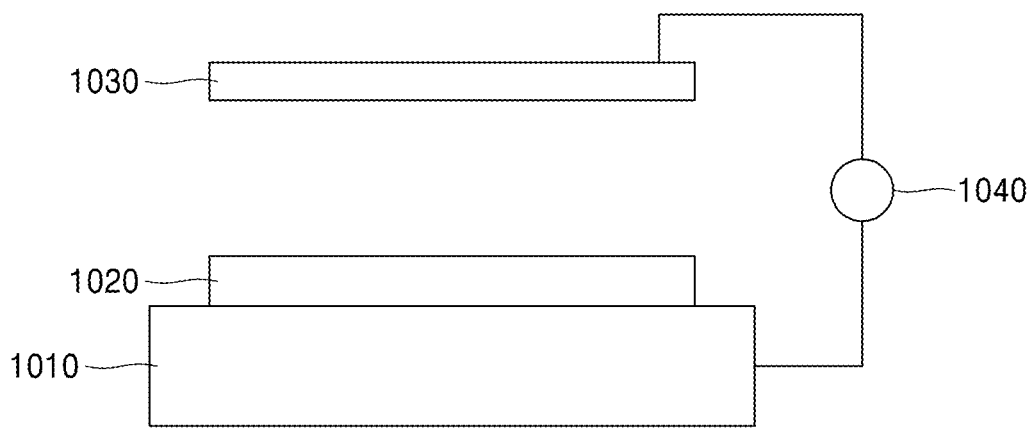
FIG. 10 is a schematic cross-sectional view illustrating a sputter or sputtering system as an example of a PVD equipment for forming a high-dielectric layer according to some example embodiments.

FIG. 10 schematically shows a sputter 1000 or sputtering system as an example of a PVD equipment used to form a high-dielectric layer according to an embodiment.

Referring to FIG. 10, the sputter 1000 includes a support 1010 supporting a substrate 1020 on which a high-dielectric layer is to be deposited and a target 1030 that includes a source material of the high-dielectric layer and faces the substrate 1020. The arrangement of the support 1010 and the target 1030 may be opposite to the arrangement in FIG. 10. The target 1030 may be fixed to a target holder and/or a target support. A power source 1040 is connected between the support 1010 and the target 1030. Ion particles having a given energy collide with the target 1030, and, due to the collision, a source material, such as atoms or molecules is emitted from the target 1030 toward the substrate 1020, and as a result, a material film including the source material is deposited on the substrate 1020. The target 1030 or a target material includes the source material for forming a high-dielectric layer according to some embodiments. In one example, the target 1030 may include most of the first material, and may include the second material within the content range described above.

Figure 11:
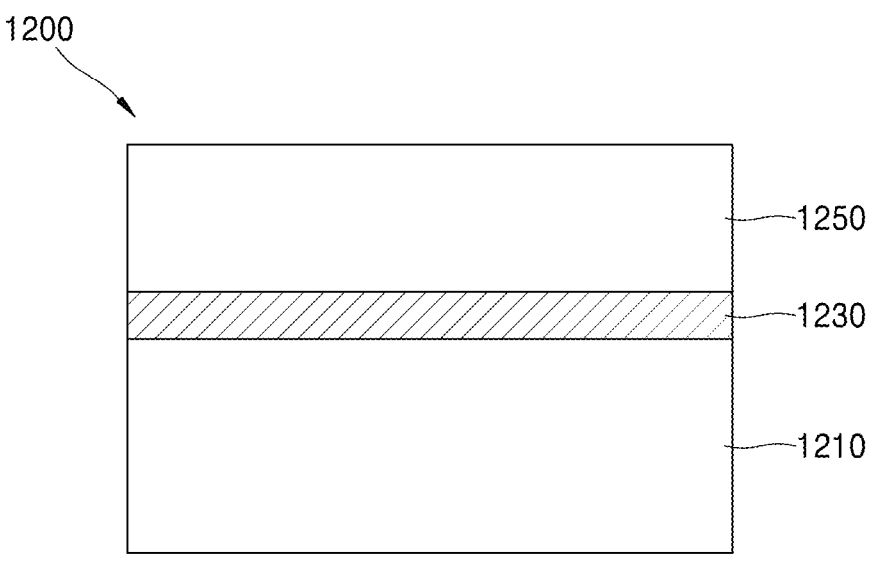
FIG. 11 is a cross-sectional view illustrating a first electronic device according to some example embodiments.

FIG. 11 shows a first electronic device according to some example embodiments. The first electronic device may include a semiconductor device having a given function or performing the given function by including a perovskite dielectric.

Referring to FIG. 11, the first electronic device 1200 includes a first stack 1210, a high-dielectric layer 1230, and a second stack 1250. In an example, the first stack 1210, the high-dielectric layer 1230, and the second stack 1250 may be sequentially stacked, but the stacking order may be reversed. The first stack 1210 may be a single layer or may include a layer structure in which a plurality of layers are stacked. The second stack 1250 may be a single layer or may include a layer structure in which a plurality of layers are stacked.

The first stack 1210 may be a layer provided on a first side and/or on a first surface of the high-dielectric layer 1230, and the second stack 1250 may be a layer provided on a second side that is different from the first side and/or on a second surface different from the first surface of the high-dielectric layer 1230.

The high-dielectric layer 1230 may be (and/or include), for example, one of the first to fifth high-dielectrics 100, 200, 300, 400, and 600. The high-dielectric layer 1230 and the first and second stacks 1210 and 1250 may be in direct contact with each other, and/or a medium (layer) may further be provided between both sides to indirectly contact each other.

In some examples, the first electronic device 1200 may be a capacitor, such that one of the first and second stacks 1210 and 1250 may be a first electrode layer, and the other may be a second electrode layer. For example, one of the first and second electrode layers may be a lower electrode, and the other may be an upper electrode.

In some examples, the first electronic device 1200 may be a solar cell including a high-dielectric layer 1230 to form a layer structure. For example, the first stack 1210 may correspond to a first layer structure of the solar cell provided on the first side of the high-dielectric layer 1230, and the second stack 1250 may correspond to a second layer structure of the solar cell provided on the second side of the high-dielectric layer 1230. At least one of the first and/or second stack 1210 and/or 1250 may include a semiconductor. In some example embodiments, the first electronic device 1200 may be a perovskite solar cell.

Figure 12:
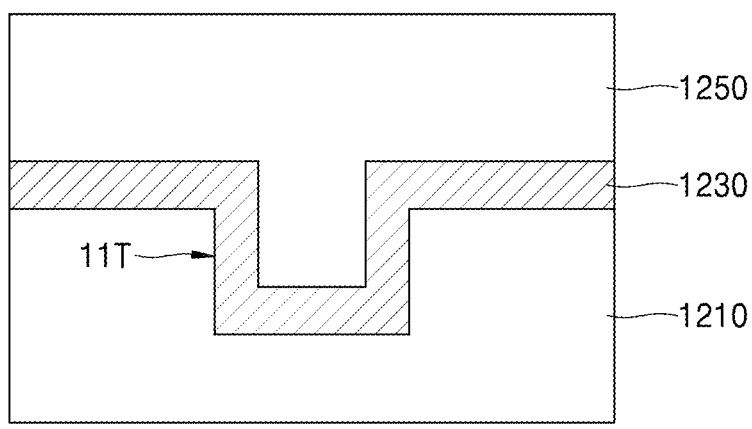
FIG. 12 is a cross-sectional view illustrating a case in which a surface of a first stack of FIG. 11 is not flat.

As shown in FIG. 11, one surface (e.g., an upper surface) of the first stack 1210 on which the high-dielectric layer 1230 is formed may be flat, but as shown in FIG. 12, it may not be flat. The one surface of the first stack 1210 may be an upper surface, a lower surface, a side surface, or the like, depending on the viewpoint.

Referring to FIG. 12, the first stack 1210 includes a structure that has a curved surface, such as a trench 11T. Because a structure having a step difference, such as the trench 11T exists in the first stack 1210, the one surface on which the high-dielectric layer 1230 of the first stack 1210 is formed is not flat. The high-dielectric layer 1230 is provided along the one surface of the first stack 1210, and the high-dielectric layer 1230 does not completely fill the trench 11T, and thus, a surface shape of the one surface is transferred to the high-dielectric layer 1230 as it is, and as a result, a surface of the high-dielectric layer 1230 also becomes a non-flat surface. The second stack 1250 may be formed on the high-dielectric layer 1230 by completely filling the trench 11T.

When the disclosed high-dielectric layer is used, the crystallization temperature is reduced, and consequently, a process temperature may be reduced. Therefore, the disclosed high-dielectric layer may be used in fields requiring a low-temperature process, for example, a process of forming a photocatalyst or a transparent electrode.

When the first electronic device 1200 functions as a capacitor, the first electronic device 1200 may be used as a decoupling capacitor for a logic device, a capacitor for energy storage, and/or the like.

Figure 13:
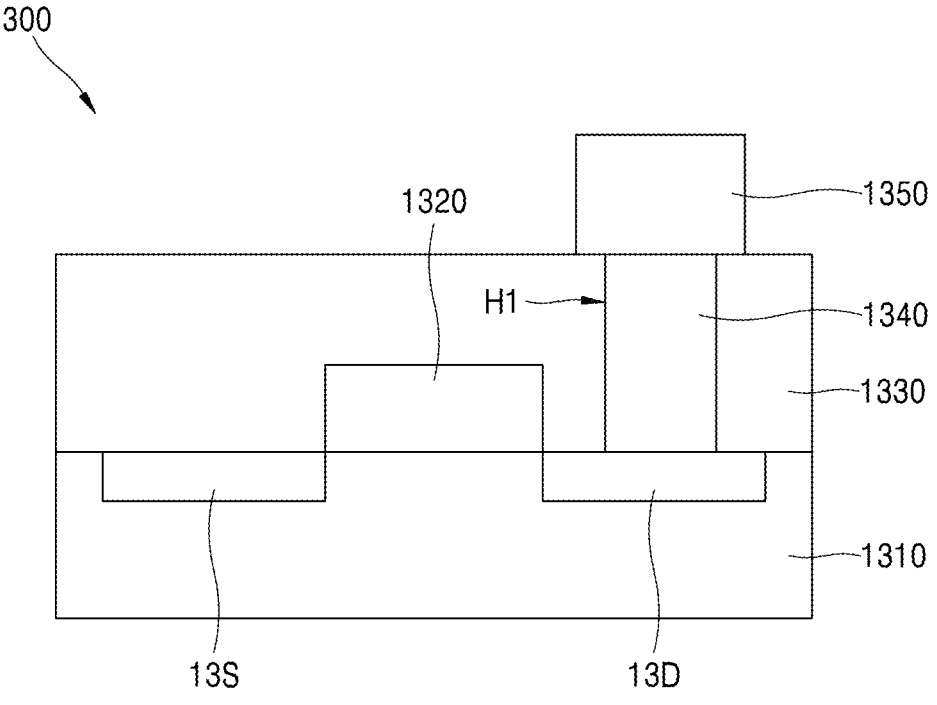
FIG. 13 is a cross-sectional view illustrating a second electronic device according to some example embodiments.

FIG. 13 shows a second electronic device 1300 according to some example embodiments. The second electronic device 1300 may be a volatile memory device, for example, a DRAM device.

Referring to FIG. 13, the second electronic device 1300 includes a substrate 1310, first and second doped regions 13S and 13D on the substrate 1310, a gate stack 1320 on the substrate 1310 between the first and second doped regions 13S and 13D, and a data storage element 1350 connected to the second doped region 13D. The substrate 1310 may include a semiconductor substrate doped with a P-type and/or N-type dopant. In some embodiments, the first and second doped regions 13S and 13D may be regions doped with a dopant of a type opposite to that of the substrate 1310. The gate stack 1320 may include a gate insulating layer and a gate electrode that are sequentially stacked. In some example embodiments, the gate insulating layer, gate electrode, and substrate may respectively be (and/or include) the first stack 1210, the high-dielectric layer 1230, and the second stack 1250. An interlayer insulating layer 1330 covering the first and second doped regions 13S and 13D and the gate stack 1320 is formed on the substrate 1310. The interlayer insulating layer 1330 includes a via hole H1 exposing a portion of the second doped region 13D. The via hole H1 is filled with a conductive plug 1340. The conductive plug 1340 may cover the entire exposed portion of the second doped region 13D. The data storage element 1350 may be provided on the interlayer insulating layer 1330, may cover an upper surface of the conductive plug 1340, and may be in direct contact with the upper surface of the conductive plug 1340. The data storage element 1350 may include a configuration capable of storing data '1' or '0'. In some examples, the data storage element 1350 may include a first electronic element used as the capacitor described with reference to FIGS. 11 and 12.

Figure 14:
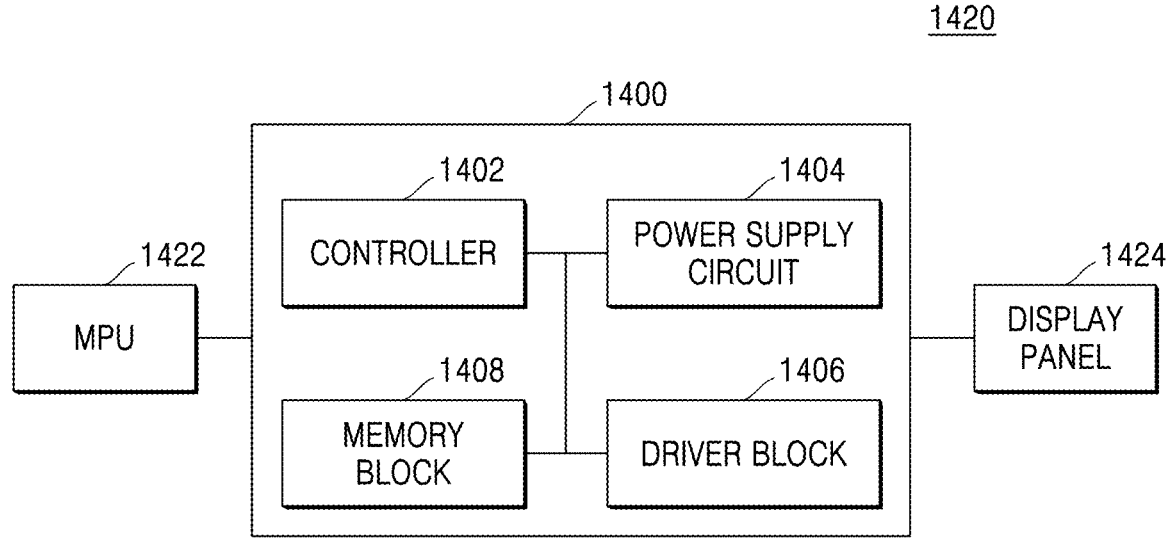
FIG. 14 is a schematic block diagram of a display driver IC (DDI) and a display device including the DDI, which relates to a first electronic device according to some example embodiments.

FIG. 14 is a schematic block diagram of a display driver integrated circuit (IC) (DDI) 1400 and a display device 1420 including the DDI 1400, which relates to a first electronic device according to some example embodiments.

Referring to FIG. 14, the DDI 1400 may include a controller 1402, a power supply circuit 1404, a driver block 1406, and a memory block 1408. The controller 1402 is configured to receive and decode a command applied from a main processing unit (MPU) 1422, and control each block of the DDI 1400 to implement an operation according to the command. The power supply circuit 1404 is configured to generate a driving voltage in response to the control of the controller 1402. The driver block 1406 is configured to drive a display panel 1424 using the driving voltage generated by the power supply circuit 1404 in response to the control of the controller 1402. The display panel 1424 may be, for example, a liquid crystal display panel or a plasma display panel. The memory block 1408 is a block for temporarily storing commands input to the controller 1402 or control signals output from the controller 1402 or for storing necessary data, and may include a memory, such as RAM or ROM. In one example, the memory block 1408 may include the high-dielectric layer according to the embodiments described above or the memory device of FIG. 13 and/or at least one of the DDI 1400 and/or the display panel 1424 may include the high-dielectric layer according to the embodiments described above, the first electronic device of FIGS. 11 and/or 12, and/or the memory device of FIG. 13.

Figure 15:
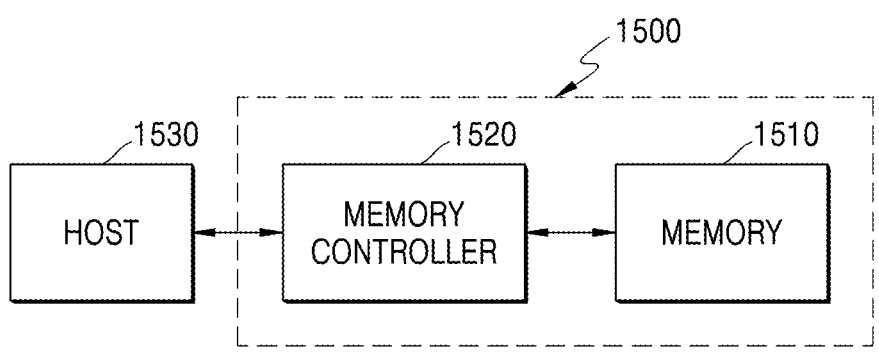
FIG. 15 is a block diagram of an electronic system related to a second electronic device according to some example embodiments.

FIG. 15 is a block diagram of an electronic system 1500 related to a second electronic device according to some example embodiments.

Referring to FIG. 15, the electronic system 1500 includes a memory 1510 and a memory controller 1520. The memory controller 1520 is configured to control the memory 1510 to read data from and/or write data into the memory 1510 in response to a request from a host 1530. At least one of the memory 1510 and/or the memory controller 1520 may include the high-dielectric layer according to the embodiments described above, the first electronic device of FIGS. 11 and/or 12, and/or the memory device of FIG. 13.

Figure 16:
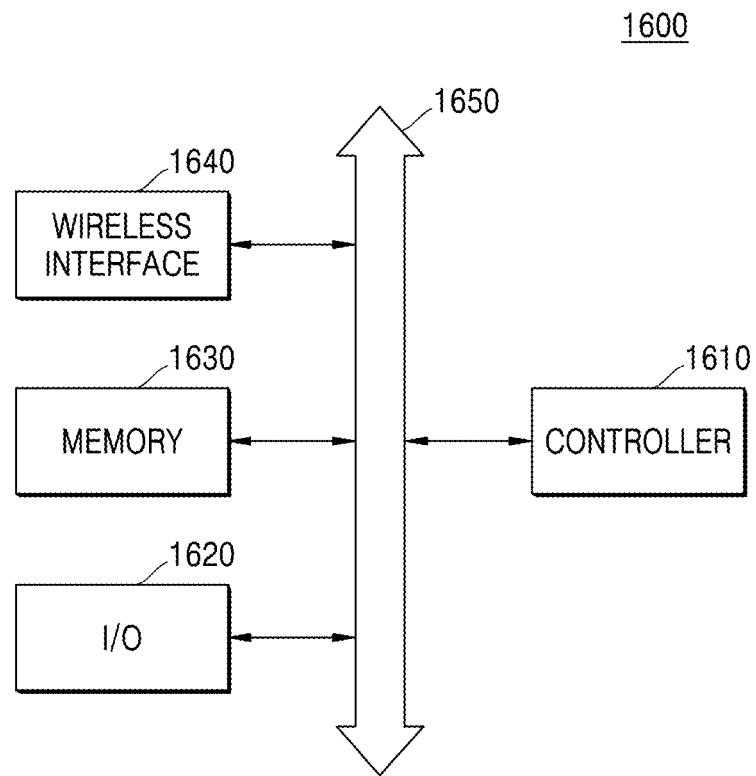
FIG. 16 is a block diagram of an electronic system relating to a third electronic device according to some example embodiments.

FIG. 16 is a block diagram of an electronic system 1600 related to a third electronic device according to some example embodiments.

The electronic system 1600 may constitute a wireless communication device and/or a device capable of transmitting and/or receiving information under a wireless environment. The electronic system 1600 includes a controller 1610, an input/output device (I/O) 1620, a memory 1630, and a wireless interface 1640, which are interconnected to each other through a bus 1650.

The controller 1610 may include at least one of a microprocessor, a digital signal processor, and a processing device similar thereto. The input/output device 1620 may include at least one of a keypad, a keyboard, and a display. Memory 1630 may be used to store instructions executed by controller 1610. For example, the memory 1630 may be used to store user data. The at least one of the controller 1610, the I/O device 1620, and/or the memory 1630 may include the high-dielectric layer according to the embodiments described above, the first electronic device of FIGS. 11 and/or 12, and/or the memory device of FIG. 13.

The electronic system 1600 may use the wireless interface 1640 to transmit/receive data over a wireless communication network. The wireless interface 1640 may include an antenna and/or a wireless transceiver. In some example embodiments, the electronic system 1600 may be used in a communication interface protocol of various communication systems, for example, code division multiple access (CDMA), global system for mobile communications (GSM), north American digital cellular (NADC), extended-time division multiple access (E-TDMA), wide band code division multiple access (WCDMA), and/or the like.

In this disclosure, the functional blocks that denote elements that process (and/or perform) at least one function or operation may be included in and/or implemented as (and/or in) processing circuitry such hardware, software, or the combination of hardware and software. For example, the processing circuitry more specifically may include (and/or be included in), but is not limited to, a processor (and/or processors), Central Processing Unit (CPU), a controller, an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

The disclosed high-dielectric is based on a perovskite dielectric, and includes indium (In) as a material component for reducing a crystallization temperature. The material component has a content capable of reducing the crystallization temperature without degrading the dielectric properties of the matrix.

Therefore, using the disclosed high-dielectric, the crystallization temperature may be reduced while maintaining the dielectric properties (e.g., leakage current characteristics) of the high-dielectric. As the crystallization temperature of the high-dielectric is reduced, the high-dielectric may be applied to a low temperature process, the temperature burden and cost of the manufacturing process may be reduced, the degree of risk of a process may also be reduced, and the progress of a process may be relatively fast compared to a high-temperature process.

It should be understood that the example embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A high-dielectric comprising:
a first material having a dielectric constant greater than a dielectric constant of silicon oxide and including oxygen and at least two components; and
a second material different from the first material,
wherein the second material reduces a crystallization temperature of the first material, and
the second material includes indium (In).

2. The high-dielectric of claim 1, wherein a content of the second material with respect to the first material is within a range that does not deteriorate a leakage current characteristic of the first material.

3. The high-dielectric of claim 2, wherein the content of the second material is in a range of 0.1 atomic % to 10 atomic %.

4. The high-dielectric of claim 1, wherein the first material includes at least one of a ternary or quaternary perovskite material.

5. The high-dielectric of claim 1, wherein the second material is uniformly distributed in the first material.

6. The high-dielectric of claim 1, wherein
the first material includes a plurality of sequentially stacked layers, and
the second material is included in a second material layer between at least two of the plurality of sequentially stacked layers.

7. The high-dielectric of claim 6, wherein the second material layer is completely embedded in the first material.

8. The high-dielectric of claim 1, wherein
the first material includes at least a first region and a second region, and
the second material is included in only the first region of the first material.

9. The high-dielectric of claim 6, wherein the second material layer is included in a plurality of second material layers separated from each other in the first material.

10. An electronic device comprising:
a first stack;
a second stack; and
a high-dielectric layer between the first stack and the second stack,
wherein the high-dielectric layer includes the high-dielectric of claim 1.

11. The electronic device of claim 10, wherein the first stack includes a first portion of a configuration constituting a solar cell including the high-dielectric layer.

12. The electronic device of claim 11, wherein the second stack includes a second portion constituting the solar cell.

13. The electronic device of claim 10, wherein
the first stack includes a first electrode layer,
the second stack includes a second electrode layer, and
the first electrode layer, the second electrode layer, and the high-dielectric layer constitute a capacitor.

14. A memory device comprising:
a transistor; and
a data storage element coupled to the transistor,
wherein the data storage element includes the electronic device of claim 10.

15. An electronic apparatus comprising the memory device of claim 14.

16. A sputtering target for forming a high-dielectric layer comprising:
a first source material including at least two different components other than oxygen such that a first material including an oxide of the at least two different components has a dielectric constant greater than a dielectric constant of silicon oxide; and
a second source material coupled to the first source material,
wherein the second source material includes a component that reduces a crystallization temperature of the first material, and
wherein the second source material includes indium (In).

17. The sputtering target of claim 16, wherein the first source material includes a perovskite-based dielectric component.

18. The sputtering target of claim 17, wherein the first source material includes a first to third components different from each other.

19. The sputtering target of claim 16, wherein a content of the second source material is within a range such that, after a sputtering operation, a content of the component that reduces the crystallization temperature of the first material, in the first material, is within a range that does not deteriorate a leakage current characteristic of the first material.

20. The sputtering target of claim 19, wherein the range of the content of the second source material is such that the range of the content of the component that reduces the crystallization temperature of the first material, in the first material, is in a range of 0.1 atomic % to 10 atomic %.

* * * * *